(12) United States Patent
Ali et al.

(10) Patent No.: US 8,151,237 B2
(45) Date of Patent: *Apr. 3, 2012

(54) DISABLING UNUSED IO RESOURCES IN PLATFORM-BASED INTEGRATED CIRCUITS

(75) Inventors: Anwar Ali, San Jose, CA (US); Julie Beatty, Campbell, CA (US); Kalyan Doddapaneni, Mountain View, CA (US)

(73) Assignee: LSI Corporation, Milpitas, CA (US)

( * ) Notice: Subject to any disclaimer, the term of this patent is extended or adjusted under 35 U.S.C. 154(b) by 572 days.

This patent is subject to a terminal disclaimer.

(21) Appl. No.: 12/229,446

(22) Filed: Aug. 22, 2008

(65) Prior Publication Data

US 2008/0320432 A1 Dec. 25, 2008

Related U.S. Application Data

(62) Division of application No. 10/909,603, filed on Aug. 2, 2004, now Pat. No. 7,430,730.

(51) Int. Cl.
  *G06F 17/50* (2006.01)
  *G06F 7/38* (2006.01)
  *H03K 19/00* (2006.01)
  *H03K 19/173* (2006.01)
  *H03K 19/177* (2006.01)
  *H01L 25/00* (2006.01)

(52) U.S. Cl. ........ 716/126; 716/129; 716/130; 716/137; 716/138; 326/8; 326/37; 326/38; 326/39; 326/41; 326/47; 326/136

(58) Field of Classification Search .............. 716/12–14, 716/126, 129, 130, 137, 138; 326/8, 37, 326/38, 39, 41, 47, 136

See application file for complete search history.

(56) References Cited

U.S. PATENT DOCUMENTS

| | | | | |
|---|---|---|---|---|
| 5,953,236 A | * | 9/1999 | Hossain et al. | 716/6 |
| 6,014,506 A | * | 1/2000 | Hossain et al. | 716/11 |
| 2003/0014703 A1 | * | 1/2003 | Chakravarthy et al. | 714/726 |
| 2003/0131323 A1 | * | 7/2003 | McConaghy | 716/2 |
| 2004/0158789 A1 | * | 8/2004 | Chakravarthy et al. | 714/741 |
| 2004/0199891 A1 | * | 10/2004 | Bentley et al. | 716/11 |
| 2005/0004780 A1 | * | 1/2005 | Lin et al. | 702/184 |
| 2005/0038544 A1 | * | 2/2005 | Lin et al. | 700/108 |
| 2005/0108667 A1 | * | 5/2005 | Iadanza et al. | 716/4 |
| 2005/0149893 A1 | * | 7/2005 | Roesner et al. | 716/4 |
| 2007/0288797 A1 | * | 12/2007 | Chakravarthy et al. | 714/30 |
| 2008/0059841 A1 | * | 3/2008 | Bordawekar et al. | 714/38 |

* cited by examiner

*Primary Examiner* — Suresh Memula

(74) *Attorney, Agent, or Firm* — Suiter Swantz pc llo

(57) ABSTRACT

The present invention is directed to methods for disabling unused IO resources in a platform-based integrated circuit. A slice is received from a vendor. The slice includes an IO circuit unused by a customer. The IO circuit is disabled. For example, when the IO circuit is desired to be tied to a power source, a primary input/output pin of the IO circuit is shorted to a power bus of the IO circuit. When the IO circuit is desired to be tied to a ground source, a primary input/output pin of the IO circuit is shorted to a ground bus of the IO circuit. When the IO circuit is desired to be left floated, a primary input/output pin of the IO circuit is not connected to any bonding pad cell of the slice. Next, the IO circuit is removed from the customer's logic design netlist. The IO circuit is inserted in the vendor's physical design database.

21 Claims, 5 Drawing Sheets

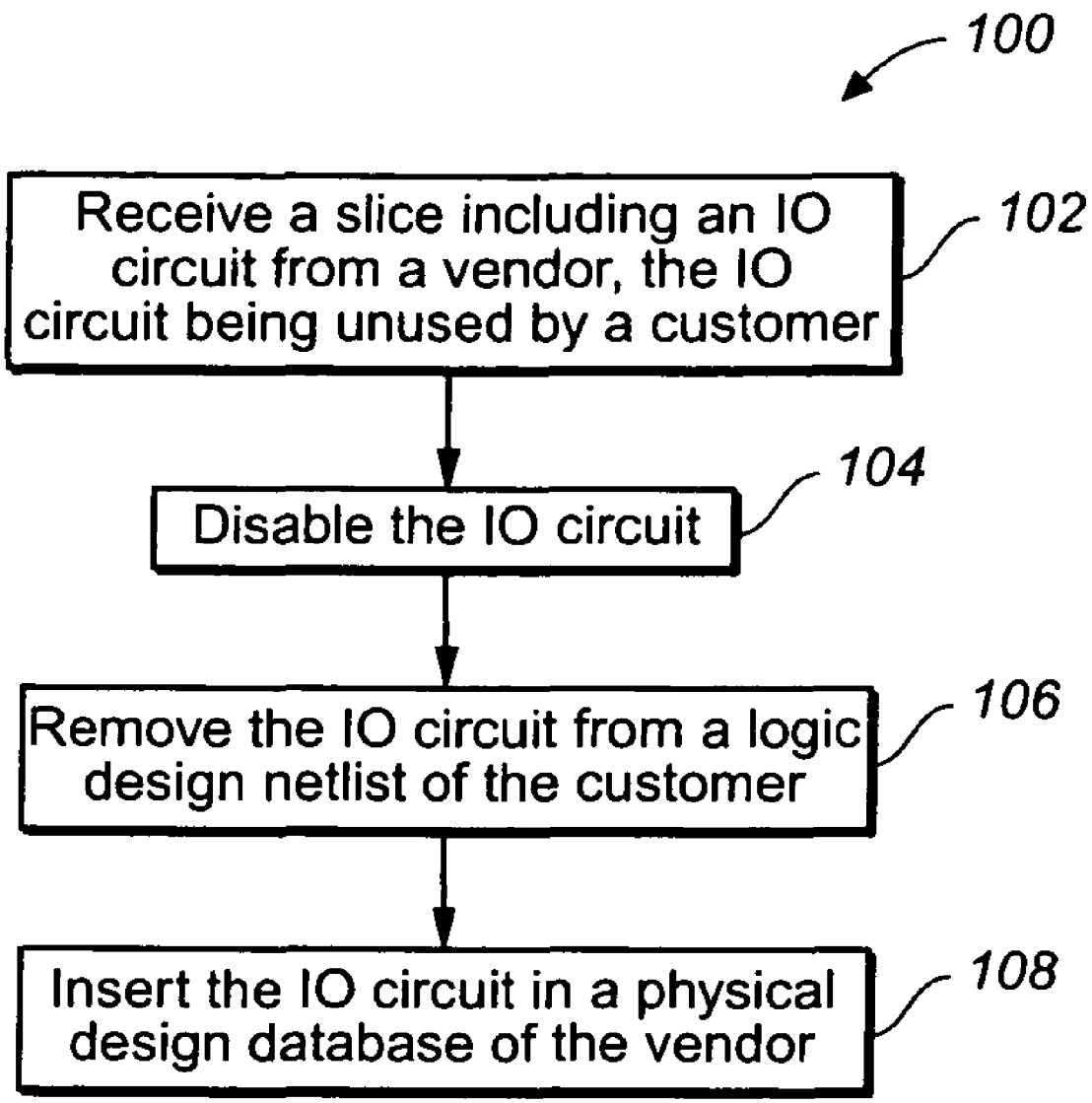
FIG._1

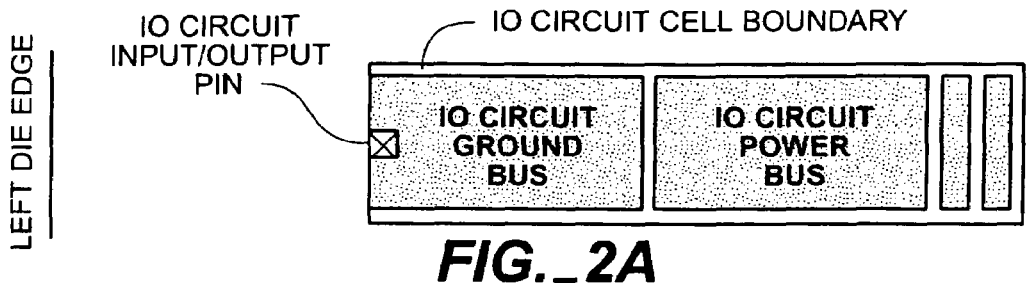
FIG._2A
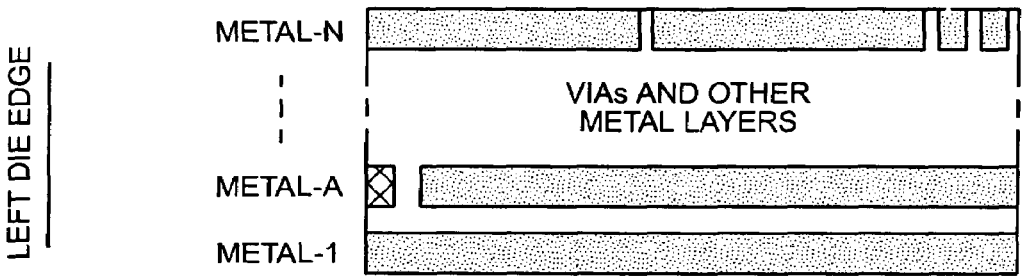
FIG._2B
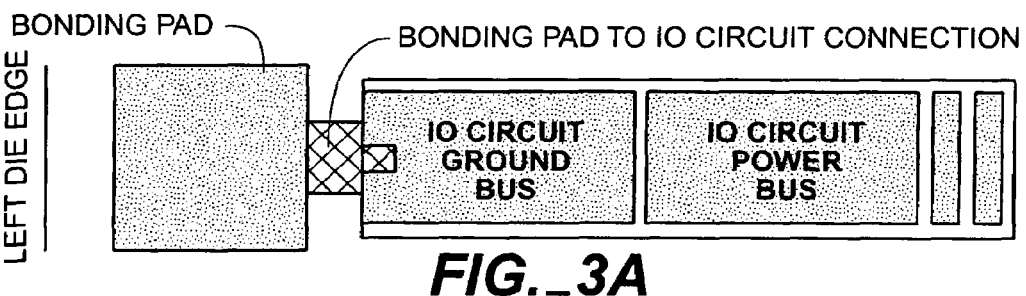
FIG._3A
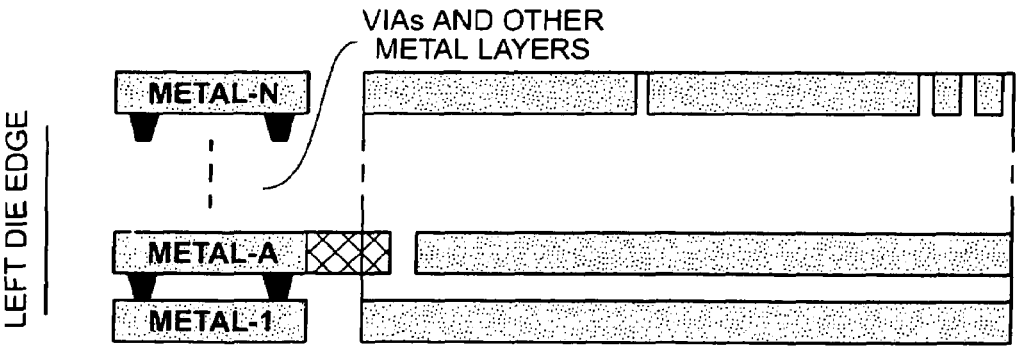
FIG._3B

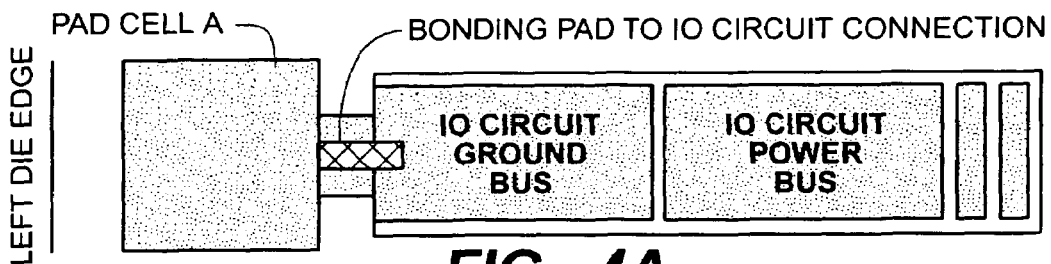
FIG._4A
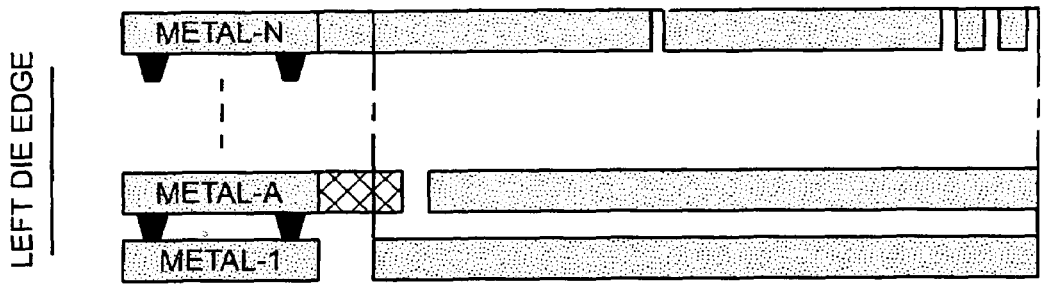
FIG._4B
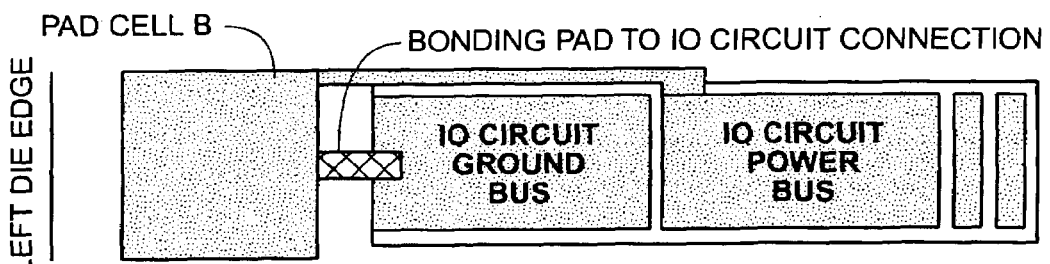
FIG._5A
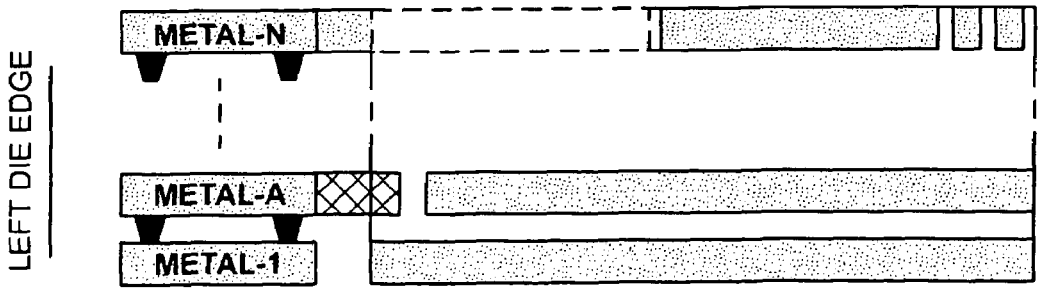
FIG._5B

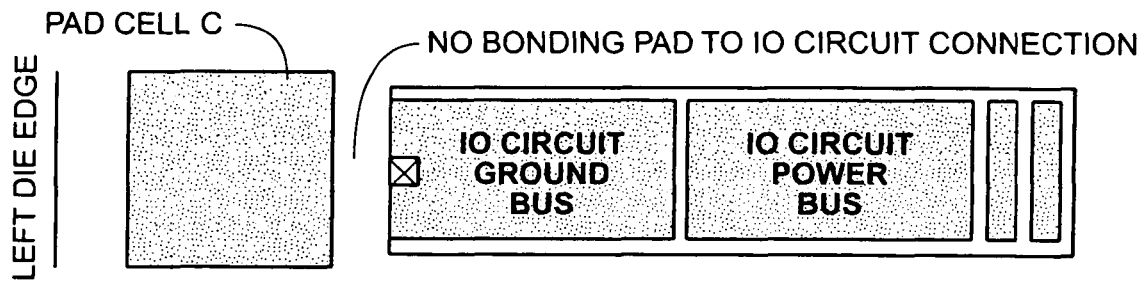
FIG._6A
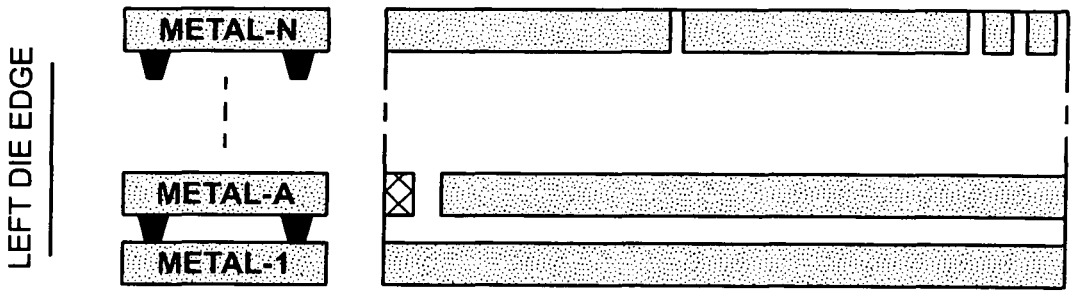
FIG._6B
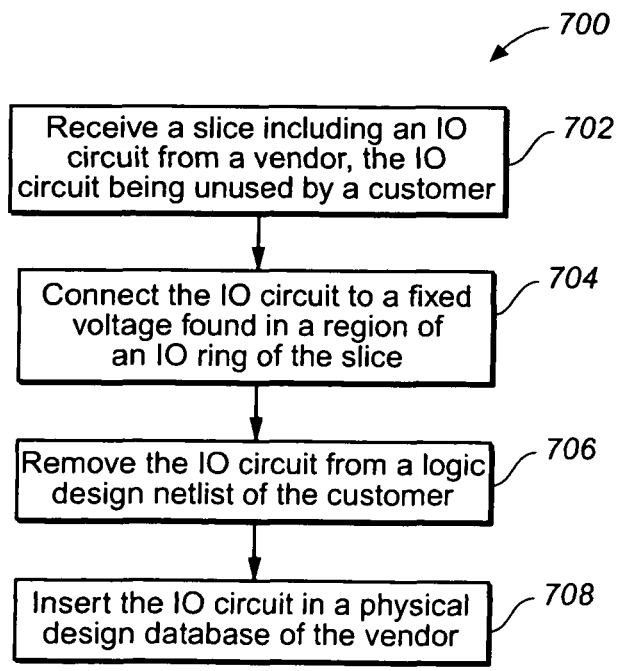
FIG._7

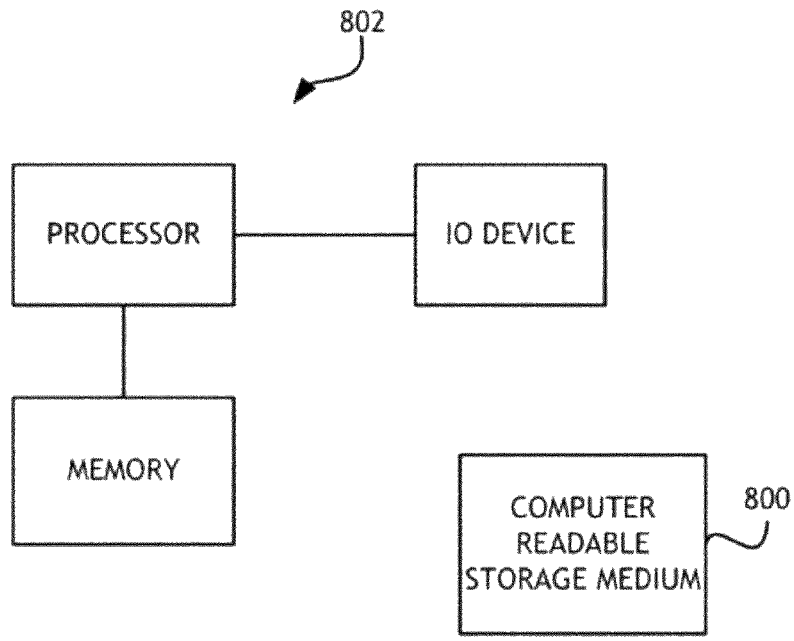
FIG._8
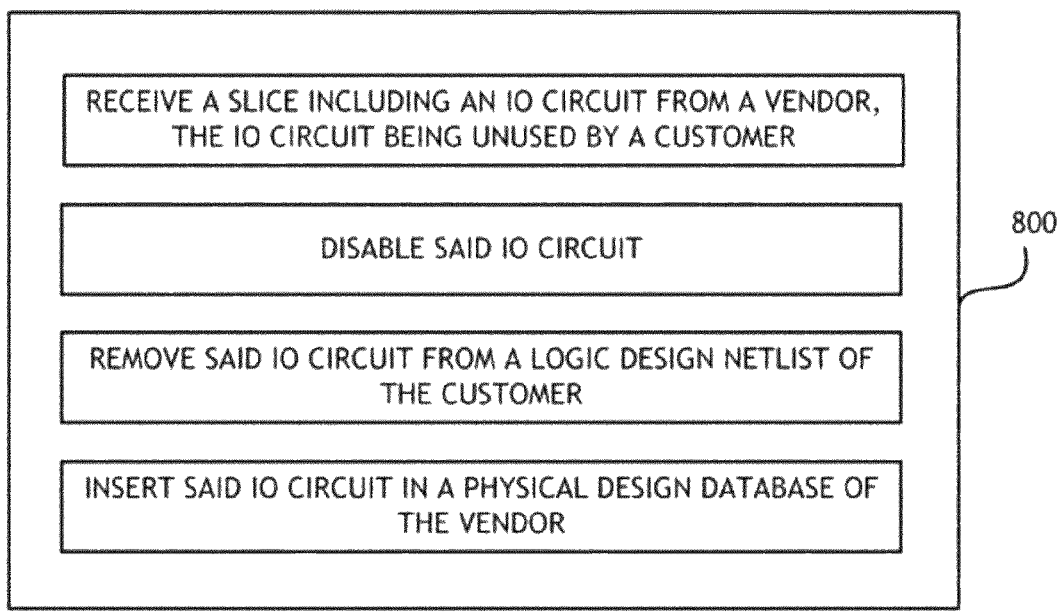
FIG._9

DISABLING UNUSED IO RESOURCES IN PLATFORM-BASED INTEGRATED CIRCUITS

CROSS-REFERENCE TO RELATED DOCUMENTS

The present application is a divisional application of U.S. patent application Ser. No. 10/909,603 filed on Aug. 2, 2004 now U.S. Pat. No. 7,430,730,. Said U.S. patent application Ser. No. 10/909,603 is hereby incorporated by reference in its entirety.

FIELD OF THE INVENTION

This invention relates generally to integrated circuits, and particularly to a method and apparatus for disabling unused IO resources in a platform-based integrated circuit.

BACKGROUND OF THE INVENTION

Platform-based IC (integrated circuit) design is a powerful concept for coping with the increased pressure on time-to-market, design and manufacturing costs encountered in the current IC market. A platform is a large-scale, high-complexity semiconductor device that includes one or more of the following elements: (1) memory; (2) a customizable array of transistors; (3) an IP (intellectual property) block; (4) a processor, e.g., an ESP (embedded standard product); (5) an embedded programmable logic block; and (6) interconnect. RapidChip™ developed by LSI Logic Corp. is an instance of a platform. The basic idea behind the platform-based design is to avoid designing and manufacturing a chip from scratch. Some portion of the chip's architecture is predefined for a specific type of application. Through extensive design reuse, the platform-based design may provide faster time-to-market and reduce design cost.

Under a platform approach, there are two distinct steps entailed in creating a final end-user product: a prefabrication step and a customization step. In a prefabrication step, a slice is built on a wafer. A slice is a pre-manufactured chip in which all silicon layers have been built, leaving the metal layers or top metal layers to be completed with the customer's unique IP. For example, RapidSlice™ developed by LSI Logic Corp. is an instance of a slice. One or more slices may be built on a single wafer. It is understood that a slice may include one or more bottom metal layers or may include no metal layers at all. In a preferred embodiment of the prefabrication step, portions of the metal layers are pre-specified to implement the pre-defined blocks of the platform and the diffusion processes are carried out in a wafer fab. The base characteristics, in terms of the IP, the processors, the memory, the interconnect, the programmable logic and the customizable transistor array, are all pre-placed in the design and pre-diffused in the slice. However, a slice is still fully decoupled because the customer has not yet introduced the function into the slice. In a customization step, the customer-designed function is merged with the pre-defined blocks and the metal layers (or late-metal components) are laid down, which couple the elements that make up the slice built in the wafer fab, and the customizable transistor array is configured and given its characteristic function. In other embodiments, early-metal steps may be part of the pre-fabricated slice to reduce the time and cost of the customization step, resulting in a platform which is more coupled and specific. It is understood that a prefabrication step and a customization step may be performed in different foundries. For example, a slice may be manufactured in one foundry. Later, in a customization step, the slice may be pulled from inventory and metalized, which gives the slice its final product characteristics in a different foundry.

A slice includes a number of IO, core macro, memory, and logic gate resources and may be used for a variety of applications. Each application may only use a subset of these resources. For example, a RapidSlice™ developed by LSI Logic Corp. may contain 600 IOs, 4M (1M=1 million) bits of memory, SERDES (Serializer/Deserializer) macros, and 5M logic gates. A particular graphics application (an instance of RapidChip™) using this slice may only require 500 of these 600 IOs, 4M bits of memory, no SERDES, and 4M logic gates, while a networking application using an identical slice may utilize all 600 IO circuits, less memory, all SERDES, and 2M gates. Unused IO resources need to be disabled since these can have implications on the interfaces to the customer's board, netlist, and testing environment.

One conventional approach to disable an unused IO circuit is to remove metal layers of the unused IO circuit. From a physical design perspective, metal interconnect may be removed from an unused IO device to effectively disable its operation for a given customer configurable application. From a logical perspective, this unused IO device is not included when the customer design netlist is created. However, this approach may have the following disadvantages. First, some IO devices, including those for mixed-signal circuits such as high speed SERDES interfaces, may exhibit high leakage currents if metallization is removed. This high leakage may unacceptable for any manufacturing test environment in addition to standard functional operation on the customer's system. Moreover, removing metal layers of an IO circuit assumes that all such layers are configurable for a given application (e.g., an instance of RapidChip™). In other words, all metal layers from METAL1 and upwards through the IO circuit must be modified for a given instance of the platform. This constraint increases the total mask cost of the instance and increases its overall NRE (Non-Recurring Engineering) cost.

Another conventional approach to disable an unused IO circuit is to ground it, float it, or tie it to a power source as appropriate to disable its functionality at the customer's circuit board level. Under this approach, an unused IO circuit remains physically present in the specific customer configurable application (e.g., an instance of RapidChip™). The unused IO circuit is fully metalized and operational and is preserved in the customer's logical design netlist. At the customer's circuit board level, the unused IO device is grounded, floated, or tied to a power source as appropriate to disable its functionality. However, this approach may have the following disadvantages. First, the customer must be educated and instructed on how to tie-off each specific unused IO resource. The unused IO resource may be tied to ground or power, or floated. In addition, tying unused IOs to power or ground forces the customer to give special circuit board design considerations to these IO resources, even though they are not being used. This introduces time, complexity, and cost to the circuit board design. Moreover, these unused IOs are preserved in the Instance design netlist. As a result, the customer must be sufficiently aware of these unused IOs even though they are not being used. This may be confusing to the customer, introduce mistakes, and create complexities in the customer's netlist generation process. Further, since the unused IO circuit is deemed functional, the unused IO circuit must be tested as part of the manufacturing test process. Consequently, test insertion logic and patterns must be created for the Instance of the platform. This introduces complexity in the design system, flow, and tools.

Thus, it would be desirable to provide a method and apparatus for disabling unused IO resources in a platform-based integrated circuit to address the foregoing-described problems.

SUMMARY OF THE INVENTION

It is an object of the present invention to hide unused IO resources from the customer from a design flow perspective. This includes hiding unused IO resources from the customer design netlist.

It is an additional object of the present invention to hide unused IO resources from a physical, electrical, and testing perspective once the physical packaged component is ready for use in the customer's system.

It is another object of the present invention to make a platform instance appear to contain only the IOs that the customer wishes to use. A key component of this is ensuring unused IOs do not appear in the customer's design netlist.

It is a further object of the present invention to impose fewer constraints on the customer which are a result of excess IOs that may be present in a slice.

It is still a further object of the present invention to provide transparency of unused IOs which may propagate the entire design flow all the way to the physical and manufactured part.

It is yet still a further object of the present invention to provide transparency of unused IOs which may be limited to from the customer's perspective only.

In an exemplary aspect of the present invention, a method for disabling unused IO resources in a platform-based integrated circuit includes steps as follows. A slice is received from a vendor. The slice includes an IO circuit unused by a customer. The IO circuit is disabled. For example, when the IO circuit is desired to be tied to a power source, a primary input/output pin of the IO circuit is shorted to a power bus of the IO circuit. When the IO circuit is desired to be tied to a ground source, a primary input/output pin of the IO circuit is shorted to a ground bus of the IO circuit. When the IO circuit is desired to be left floated, a primary input/output pin of the IO circuit is not connected to any bonding pad cell of the slice. Next, the IO circuit is removed from the customer's logic design netlist. The IO circuit is inserted in the vendor's physical design database.

In an additional exemplary aspect of the present invention, a method for disabling unused IO resources in a platform-based integrated circuit includes steps as follows. A slice is received from a vendor. The slice includes an IO circuit unused by a customer. The IO circuit is connected to a fixed voltage found in a region of an IO ring of the slice. The IO circuit is removed from the customer's logic design netlist. The IO circuit is inserted in the vendor's physical design database.

In another exemplary aspect of the present invention, a method for disabling an IO circuit including a primary input/output pin, a power bus and a ground bus in a slice includes steps as follows. When the IO circuit is desired to be tied to a power source, the primary input/output pin is shorted to the power bus. When the IO circuit is desired to be tied to a ground source, the primary input/output pin is shorted to the ground bus.

In a further exemplary aspect of the present invention, a semiconductor device includes an IO circuit and a bonding pad cell adjacent the IO circuit. The IO circuit includes a primary input/output pin, a power bus and a ground bus. The bonding pad cell may be used to disable the IO circuit.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a flow diagram of a method for disabling unused IO resources in a platform-based integrated circuit in accordance with an exemplary embodiment of the present invention;

FIGS. 2A and 2B are a plan view and a cross-section view of an IO circuit including a primary input/output pin, a power bus and a ground bus, respectively, in accordance with an exemplary embodiment of the present invention;

FIGS. 3A and 3B are a plan view and a cross-section view, respectfully, of the IO circuit shown in FIGS. 2A and 2B and a bonding pad cell adjacent the IO circuit in accordance with an exemplary embodiment of the present invention, where the bonding pad cell is connected to the primary input/output pin;

FIGS. 4A and 4B are a plan view and a cross-section view, respectively, of an IO circuit shown in FIGS. 2A and 2B and a bonding pad cell adjacent the IO circuit in accordance with an exemplary embodiment of the present invention, where the IO circuit is disabled by shorting the primary input/output pin to the ground bus via the bonding pad cell;

FIGS. 5A and 5B are a plan view and a cross-section view, respectively, of an IO circuit shown in FIGS. 2A and 2B and a bonding pad cell adjacent the IO circuit in accordance with an exemplary embodiment of the present invention, where the IO circuit is disabled by shorting the primary input/output pin to the power bus via the bonding pad cell;

FIGS. 6A and 6B are a plan view and a cross-section view, respectively, of an IO circuit shown in FIGS. 2A and 2B and a bonding pad cell adjacent the IO circuit in accordance with an exemplary embodiment of the present invention, where the IO circuit is disabled by keeping the primary input/output pin unconnected to the bonding pad cell;

FIG. 7 is a flow diagram of a method for disabling unused IO resources in a platform-based integrated circuit in accordance with an additional exemplary embodiment of the present invention;

FIG. 8 is block diagram of a system useful for performing the methods described herein; and FIG. 9 is block diagram of a computer usable medium storing computer code for performing operations according to the present invention.

DETAILED DESCRIPTION OF THE INVENTION

Reference will now be made in detail to the presently preferred embodiments of the invention, examples of which are illustrated in the accompanying drawings.

The present invention provides a method and apparatus for disabling unused IO resources in a platform-based integrated circuit. One conventional approach must tie unused IO devices to ground or power, or leave floated to appropriately disable IO circuit operation. This approach is valid, but this tie-off mechanism must be done at the circuit board level which requires customer awareness. Additionally and as a consequence, unused IO circuits are still represented in the customer's design netlist, which may be confusing and may complicate the customer's netlist generation process. The present invention uses a die based tie-off scheme which removes the need for special consideration as the customer creates its own circuit board design. Unused IOs are removed from the customer's logical design netlist, and inserted as backend only objects in the vendor's physical design database only. This simplifies the customer's design netlist.

FIG. 1 is a flow diagram of a method 100 for disabling unused IO resources in a platform-based integrated circuit in accordance with an exemplary embodiment of the present invention. The method 100 may start with step 102 in which a slice including an IO circuit unused by a customer is received from a vendor.

The unused IO circuit is disabled 104. For example, when the IO circuit is desired to be tied to a power source, a primary input/output pin of the IO circuit is shorted to a power bus of the IO circuit. When the IO circuit is desired to be tied to a ground source, a primary input/output pin of the IO circuit is shorted to a ground bus of the IO circuit. When the IO circuit is desired to be left floated, a primary input/output pin of the IO circuit is not connected to any bonding pad cell of the slice.

The physical layout of an IO circuit typically includes placement of a primary input/output pin at the edge of the cell boundary on a given metal layer A (see, e.g., FIGS. 2A and 2B). It is understood that the metal layer A may be any metal layer other than the uppermost metal layer N. As shown in FIGS. 2A and 2B, internal to the IO circuit design, a power bus and a ground bus are typically present on the uppermost metal layer N of the physical layout of the IO circuit. When the IO circuit is connected to the package, a bonding pad cell is attached to the IO circuit, and the bonding pad cell connects to the primary input/output pin on the same metal layer A (see, e.g., FIGS. 3A and 3B). As shown in FIGS. 3A and 3B, all other layers of the bonding pad cell are notched back to ensure they do not short to other IO circuit structures. According to the present invention, for a given Instance of a platform, a collection of bonding pad cells is available. Each bonding pad cell is identical with the exception of minor metallization differences which realize the required tie to ground, tie to power, or float scenarios. Depending on which tie-off or float mechanism is required, the appropriate bonding pad cell is used when the Instance of the platform is created.

When the unused IO circuit is desired to be tied to ground, a bonding pad cell A may be used. In this pad cell version, the primary input/output pin on metal layer A is shorted to the ground bus on metal layer N within the bond pad cell via the bonding pad cell A (see, e.g., FIGS. 4A and 4B). Preferably, an uppermost metal layer N of the bonding pad cell A is connected to the ground bus, and metal layer A of the bonding pad cell A is connected to the primary input/output pin. Those of ordinary skill in the art will understand that the short to the ground bus may also be created on other metal layers without departing from the scope and spirit of the present invention. Alternatively, the unused IO circuit which must be tied to ground may be re-routed to the ground bus internal to the die. In other words, the tie-off does not necessarily need to be done within the bonding pad cell A.

When the unused IO circuit is desired to be tied to power, a bonding pad cell B may be used. In this pad cell version, the primary input/output pin on metal layer A is shorted to the power bus on metal layer N within the bond pad cell via the bonding pad cell B (see, e.g., FIGS. 5A and 5B). Preferably, an uppermost metal layer N of the bonding pad cell B is connected to the power bus, and metal layer A of the bonding pad cell A is connected to the primary input/output pin. Those of ordinary skill in the art will understand that the short to the power bus may also be created on other metal layers without departing from the scope and spirit of the present invention. Alternatively, the unused IO circuit which must be tied to power may be re-routed to the power bus internal to the die. In other words, the tie-off does not necessarily need to be done within the bonding pad cell B.

When the unused IO circuit is desired to be left floated, a bonding pad cell C may be used. In this pad cell version, no connection is made between the pad cell C and the primary input/output pin on metal layer A (see, e.g., FIGS. 6A and 6B). When the primary input/output pin use multiple metal layers, the bonding pad cell is not connected to any of these metal layers. Alternatively, when the IO circuit is desired to be left floated and when the slice is packaged in wirebond packaging, a bonding wire corresponding to the IO circuit may be removed, and when the IO circuit is desired to be left floated and when the slice is packaged in flipchip packaging, a flipchip bump corresponding to the IO circuit may be removed.

Referring back to FIG. 1, the unused IO circuit is removed from the customer's logic design netlist 106. By using a die tie-off or float approach, it no longer becomes necessary for the customer to give special consideration during the circuit board design. As a result, the unused IO circuit may be removed from the customer's logic design netlist.

The unused IO circuit is inserted in the vendor's physical design database 108. During physical layout of the Instance of the platform, the unused IO circuit must still be placed since it remains fully metalized. This is accomplished by inserting the unused IO circuit in the physical design database internal the platform vendor. The IO circuit may be inserted as an ECO (Engineering Change Order) to the netlist. Since this is done as an ECO in the physical design flow, the unused IO circuit is transparent to the customer.

FIG. 7 is a flow diagram of a method 700 for disabling unused IO resources in a platform-based integrated circuit in accordance with an additional exemplary embodiment of the present invention. The method 700 may start with step 702 in which a slice including an IO circuit unused by a customer is received from a vendor. The IO circuit is connected to a fixed voltage (e.g., ground supply, 3.3v, 5v or any other voltage supply which is applicable to disable IO circuit functionality) found in a region of an IO ring of the slice to disable the IO circuit 704. The IO circuit is removed from the customer's logic design netlist 706. The IO circuit is inserted in the vendor's physical design database 708.

Thus, the present invention may provide a collection of bonding pad cells, each of which provides a means to tie an unused IO circuit to a POWER or GROUND supply, or to leave an unused IO circuit floating. This means may be accomplished internal to the bonding pad cell. With the exception of these tie-off or float mechanisms, each bonding pad design is otherwise identical. Depending on the specific scenario, an unused IO circuit may be connected to one of these pad choices to achieve the required result. The present invention may provide a means of not including unused IO circuits in the customer's logic design netlist. Since unused IO circuits are still fully metalized, they are re-inserted as ECOs in the vendor's physical only database.

The present invention may have the following advantages. First, unused IOs are hidden from the customer. IO circuits which the customer does not wish to use may be totally ignored. The customer is no longer required to insert unused IO circuits in the design netlist. This may simplify the customer's internal netlist creation process and avoid the possible mistake of accidentally using the unused IO resources. In addition, there is no customer circuit board tie-off. The customer is no longer required to tie, float, or give special consideration to the corresponding package balls connecting these unused IOs. This may simplify the board design and reduce cost and design time. Moreover, compared to the conventional approach of removing all IO circuit metallization, which may encompass several metal layers, the present approach only involves one metal layer change which may be internal to the bond pad. A single metal layer change reduces NRE (Non-Recurring Engineering) cost of the design as well as fabrication processing time. If the customer later wishes to utilize one of these IO circuits, it can easily be accomplished by making this single layer change. Additionally, the present invention provides a simpler design implementation flow. By removing unused IO circuits from the netlist, the design implementation flow is simplified. This may save steps such as simulation, formal verification, and static timing analysis, all of which would otherwise have to place special consideration to the unused resources. Compared to the conventional approach of removing all IO circuit metallization, the present approach only makes very minor metallization changes which may be limited to just the bonding pad cell. As a result, the present approach presents less risk to the integrity of the design, and reduces the possibility of inadvertently removing incorrect metallization within the semiconductor instance. Furthermore, the present invention provides simpler design tool automation. Compared to the conventional approach of removing all IO circuit metallization, the bond pad tie off or float is a simpler scheme from a tool automation perspective. This is because the tie-off or float mechanism may be designed into the bonding pad structure. Depending on which tie-off or float mechanism is required, the appropriate bonding pad cell is used. Moreover, the present invention provides a simpler testing flow. Since unused IO circuits are tied or floated on the die, manufacturing test engineers do not need to test these circuits. This is because the unused circuits are always be tied or floated and there is no possibility for the customer to use them in any other fashion. As a result, no testing is required. This may reduce tester hardware costs and test time, and simplify the testing process.

It is to be noted that the foregoing described embodiments according to the present invention may be conveniently implemented using conventional general purpose digital computers 802 programmed according to the teachings of the present specification, as may be apparent to those skilled in the computer art. Appropriate software coding may readily be prepared by skilled programmers based on the teachings of the present disclosure, as may be apparent to those skilled in the software art.

It is to be understood that the present invention may be conveniently implemented in forms of a software package. Such a software package may be a computer program product which employs a computer-readable storage medium 800 including stored computer code which is used to program a computer to perform the disclosed function and process of the present invention. The computer-readable medium may include, but is not limited to, any type of conventional floppy disk, optical disk, CD-ROM, magneto-optical disk, ROM, RAM, EPROM, EEPROM, magnetic or optical card, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for converting unused IO resources to a disabled state in a platform-based integrated circuit, comprising steps of:
   receiving a slice including an IO circuit from a vendor, said IO circuit being unused by a customer;
   disabling said IO circuit;
   removing said IO circuit from a logic design netlist of said customer; and
   inserting said IO circuit in a physical design database of said vendor.

2. The method of claim 1, wherein said disabling step comprises when said IO circuit is desired to be tied to a power source, shorting a primary input/output pin of said IO circuit to a power bus of said IO circuit.

3. The method of claim 2, wherein said shorting occurs via a bonding pad cell of said slice, said bonding pad cell being connected to said primary input/output pin and said power bus.

4. The method of claim 3, wherein said power bus is on an uppermost metal layer of said IO circuit.

5. The method of claim 4, wherein said primary input/output pin is on a metal layer of said IO circuit, said metal layer being not said uppermost metal layer of said IO circuit.

6. The method of claim 5, wherein an uppermost metal layer of said bonding pad cell is connected to said power bus, and a metal layer of said bonding pad cell is connected to said primary input/output pin, said metal layer of said bonding pad cell being not said uppermost metal layer of said bonding pad cell.

7. The method of claim 2, wherein said shorting occurs by connecting, inside said IO circuit, said primary input/output pin to said power bus without using a bonding pad cell of said slice.

8. The method of claim 1, wherein said disabling step comprises when said IO circuit is desired to be tied to a ground source, shorting a primary input/output pin of said IO circuit to a ground bus of said IO circuit.

9. The method of claim 8, wherein said shorting occurs via a bonding pad cell of said slice, said bonding pad cell being connected to said primary input/output pin and said ground bus.

10. The method of claim 9, wherein said ground bus is on an uppermost metal layer of said IO circuit.

11. The method of claim 10, wherein said primary input/output pin is on a metal layer of said IO circuit, said metal layer being not said uppermost metal layer of said IO circuit.

12. The method of claim 11, wherein an uppermost metal layer of said bonding pad cell is connected to said ground bus, and a metal layer of said bonding pad cell is connected to said primary input/output pin, said metal layer of said bonding pad cell being not said uppermost metal layer of said bonding pad cell.

13. The method of claim 8, wherein said shorting occurs by connecting, inside said IO circuit, said primary input/output pin to said ground bus without using a bonding pad cell of said slice.

14. The method of claim 1, wherein said disabling step comprises when said IO circuit is desired to be left floated, keeping a primary input/output pin of said IO circuit unconnected to any bonding pad cell of said slice.

15. The method of claim 1, wherein said disabling step comprises when said IO circuit is desired to be left floated and when said slice is packaged in wirebond packaging, removing a bonding wire corresponding to said IO circuit.

16. The method of claim 1, wherein said disabling step comprises when said IO circuit is desired to be left floated and when said slice is packaged in flipchip packaging, removing a flip chip bump corresponding to said IO circuit.

17. A tangible, non-transitory, computer usable medium having computer-executable instructions for performing a method for converting unused IO resources to a disabled state in a platform-based integrated circuit, said method comprising steps of:
- receiving a slice including an IO circuit from a vendor, said IO circuit being unused by a customer;
- disabling said IO circuit;
- removing said IO circuit from a logic design netlist of said customer; and
- inserting said IO circuit in a physical design database of said vendor.

18. The tangible, non-transitory, computer useable medium of claim 17, wherein said disabling step comprises when said IO circuit is desired to be tied to a power source, shorting a primary input/output pin of said IO circuit to a power bus of said IO circuit.

19. The tangible, non-transitory, computer usable medium of claim 17, wherein said disabling step comprises when said IO circuit is desired to be tied to a ground source, shorting a primary input/output pin of said IO circuit to a ground bus of said IO circuit.

20. The tangible, non-transitory, computer useable medium of claim 17, wherein said disabling step comprises when said IO circuit is desired to be left floated, keeping a primary input/output pin of said IO circuit unconnected to any bonding pad cell of said slice.

21. A method for converting unused IO resources to a disabled state in a platform-based integrated circuit, comprising steps of:
- receiving a slice including an IO circuit from a vendor, said IO circuit being unused by a customer;
- connecting said IO circuit to a fixed voltage in a region of said slice;
- removing said IO circuit from a logic design netlist of said customer; and
- inserting said IO circuit in a physical design database of said vendor.

* * * * *